(12) United States Patent
Chung

(10) Patent No.: US 7,154,046 B2
(45) Date of Patent: Dec. 26, 2006

(54) FLEXIBLE DIELECTRIC ELECTRONIC SUBSTRATE AND METHOD FOR MAKING SAME

(75) Inventor: Kevin Kwong-Tai Chung, Princeton, NJ (US)

(73) Assignee: Amerasia International Technology, Inc., Princeton, NJ (US)

(*) Notice: Subject to any disclaimer, the term of this patent is extended or adjusted under 35 U.S.C. 154(b) by 0 days.

(21) Appl. No.: 10/774,882

(22) Filed: Feb. 9, 2004

(65) Prior Publication Data

US 2004/0159462 A1 Aug. 19, 2004

Related U.S. Application Data

(63) Continuation of application No. 09/578,583, filed on May 25, 2000, now Pat. No. 6,717,819, which is a continuation-in-part of application No. 09/412,052, filed on Oct. 4, 1999, now Pat. No. 6,288,905, and a continuation-in-part of application No. 09/524,148, filed on Mar. 14, 2000, now Pat. No. 6,376,769.

(60) Provisional application No. 60/180,907, filed on Feb. 8, 2000, provisional application No. 60/180,544, filed on Feb. 7, 2000, provisional application No. 60/150,869, filed on Aug. 26, 1999, provisional application No. 60/150,437, filed on Aug. 24, 1999, provisional application No. 60/141,344, filed on Jun. 28, 1999, provisional application No. 60/136,917, filed on Jun. 1, 1999.

(51) Int. Cl.
 *H05K 1/02* (2006.01)

(52) U.S. Cl. .............. 174/259; 174/254; 174/255; 174/260; 361/776; 361/777

(58) Field of Classification Search ........ 174/258–264; 361/782–784, 792–795; 29/830–832, 852–854; 156/306.6, 275.1, 275.3; 257/787–790, 723–724; 428/209–210, 901, 473.5, 195.1
See application file for complete search history.

(56) References Cited

U.S. PATENT DOCUMENTS

| 3,555,364 A | 1/1971 | Matcovich |
| 4,734,825 A | 3/1988 | Peterson |
| 5,043,794 A | 8/1991 | Tai et al. |
| 5,148,265 A | 9/1992 | Khandros et al. |
| 5,172,303 A | 12/1992 | Bernardoni et al. |

(Continued)

FOREIGN PATENT DOCUMENTS

WO  WO 98/26476  6/1998

(Continued)

OTHER PUBLICATIONS

Co Van Veen, *IC Packaging And Assembly Issues For Next Generation Miniaturised Consumer Electrons*, Future Fab International,, pp. 379-382 (4 Pages).

(Continued)

*Primary Examiner*—Tuan Dinh
(74) *Attorney, Agent, or Firm*—Dann, Dorfman, Herrell and Skillman, P.C.; Clement A. Berard

(57) ABSTRACT

A molecularly flexible dielectric electronic substrate for receiving an electronic device has a modulus of elasticity less tan about 500,000 psi. The molecularly flexible dielectric substrate comprises one or more sheets or layers of a molecularly flexible dielectric adhesive having a modulus of elasticity less than about 500,000 psi and having patterned metal foil electrical conductors thereon. The molecularly flexible dielectric adhesive may have a low glass transition temperature and the ability to withstand soldering.

23 Claims, 7 Drawing Sheets

U.S. PATENT DOCUMENTS

| | | | |
|---|---|---|---|
| 5,192,716 A | | 3/1993 | Jacobs |
| 5,286,926 A | | 2/1994 | Kimura et al. |
| 5,337,179 A | * | 8/1994 | Hodges ...................... 359/443 |
| 5,347,159 A | | 9/1994 | Khandros et al. |
| 5,367,764 A | | 11/1994 | DiStefano et al. |
| 5,371,654 A | | 12/1994 | Beaman et al. |
| 5,375,041 A | | 12/1994 | McMahon |
| 5,386,341 A | | 1/1995 | Olson et al. |
| 5,394,303 A | | 2/1995 | Yamaji |
| 5,519,177 A | * | 5/1996 | Wang et al. ................ 174/259 |
| 5,548,091 A | | 8/1996 | DiStefano et al. |
| 5,558,928 A | | 9/1996 | DiStefano et al. |
| 5,570,504 A | | 11/1996 | DiStefano et al. |
| 5,583,321 A | | 12/1996 | DiStefano et al. |
| 5,672,548 A | | 9/1997 | Culnane et al. |
| 5,682,061 A | | 10/1997 | Khandros et al. |
| 5,685,885 A | | 11/1997 | Khandros et al. |
| 5,686,699 A | | 11/1997 | Chu et al. |
| 5,734,555 A | | 3/1998 | McMahon |
| 5,777,379 A | | 7/1998 | Karavakis et al. |
| 5,783,870 A | | 7/1998 | Mostafazadeh et al. |
| 5,794,330 A | | 8/1998 | DiStefano et al. |
| 5,798,564 A | | 8/1998 | Eng et al. |
| 5,801,439 A | | 9/1998 | Fujisawa et al. |
| 5,847,929 A | * | 12/1998 | Bernier et al. ............... 361/719 |
| 5,848,467 A | | 12/1998 | Khandros et al. |
| 5,861,666 A | | 1/1999 | Bellaar |
| 5,875,545 A | | 3/1999 | DiStefano et al. |
| 5,901,041 A | | 5/1999 | Davies et al. |
| 5,915,170 A | | 6/1999 | Raab et al. |
| 5,926,369 A | | 7/1999 | Ingraham et al. |
| 5,929,517 A | | 7/1999 | DiStefano et al. |
| 5,943,213 A | | 8/1999 | Sasov |
| 5,950,304 A | | 9/1999 | Khandros et al. |
| 5,984,691 A | * | 11/1999 | Brodsky et al. ............... 439/66 |
| 6,121,553 A | * | 9/2000 | Shinada et al. ............. 174/259 |
| 6,265,782 B1 | * | 7/2001 | Yamamoto et al. ......... 257/783 |

FOREIGN PATENT DOCUMENTS

| | | |
|---|---|---|
| WO | WO 98/44564 | 10/1998 |

OTHER PUBLICATIONS

Jack Fisher, *Advancements in Multilayer Material Technology*, Future Circuits International, 4 Pages.

Petri Savolainen, *Area Array Packages And High-Density Printed Wiring Boards*, Future Circuits International, pp. 193-195 (3 Pages).

Patrick Thompson, *Chip-scale Packaging*, IEEE Spectrum, Aug. 1997, pp. 36-43 (8 Pages).

Dennis Herrell, *Power to the Package*, IEEE Spectrum, Jul. 1999, pp. 46-53 (8 Pages).

Vern Solberg, *Chip-Scale Array Devices*, Future Circuits International, 5-Pages.

Joan Tourné, *The Future Of Non-Woven Laminates*, Future Circuits International, pp. 129-131 (3 Pages).

Walter Olbrich, *High Density Printed Circuit Board Technologies*, Future Circuits International, pp. 133-138 (6 Pages).

Ivan Ho, *Microvia Technology*, Future Circuits International, pp. 139-141 (3 Pages).

Dieter Bergman, *BGAs The Component Package Of Choice*, Future Circuits International, 7 Pages.

Mark Hutton, *High Density Substrates for IC Packaging*, Future Circuits International, 3 Pages.

Ravi M. Bhatkal, *Techno-Economic Analysis of Alternative Wafer Bumping Technologies*, Future Circuits International, 4 Pages.

*International Search Report*, PCT/US00/13077, Aug. 18, 2000 (2 Pages).

* cited by examiner

FLEXIBLE DIELECTRIC ELECTRONIC SUBSTRATE AND METHOD FOR MAKING SAME

This Application is a continuation of U.S. patent application Ser. No. 09/578,583 filed May 25, 2000 now U.S. Pat. No. 6,717,819, which is a continuation-in-part of U.S. patent application Ser. No. 09/412,052 filed Oct. 4, 1999 (now U.S. Pat. No. 6,288,905) and of U.S. patent application Ser. No. 09/524,148 filed Mar. 14, 2000 (now U.S. Pat. No. 6,376,769), and claims the benefit of U.S. Provisional Application Ser. No. 60/136,917 filed Jun. 1, 1999, of U.S. Provisional Application Ser. No. 60/141,344 filed Jun. 28, 1999, of U.S. Provisional Application Ser. No. 60/150,437 filed Aug. 24, 1999, of U.S. Provisional Application Ser. No. 60/150,869 filed Aug. 26, 1999, of U.S. Provisional Application Ser. No. 60/180,544 filed Feb. 7, 2000, and of U.S. Provisional Application Ser. No. 60/180,907 filed Feb. 8, 2000.

The present invention relates to a flexible electronic substrate and, in particular, to a molecularly flexible electronic substrate including a molecularly flexible dielectric adhesive having a low modulus of elasticity.

As semiconductor integrated circuit technology has advanced to greatly increase the amount and operating speed of the circuitry that can be fabricated on a single semiconductor chip, it has become more difficult to effectively utilize such integrated circuits due to the greatly increased number of input and output connections to the chip and the decreasing spacing or pitch of those connections. The connection problem has become more severe where the numbers of connections exceeds that conveniently or economically attainable in a conventional mechanical package.

One approach to solve this problem utilizes semiconductor chips mounted with contacts against and connecting to corresponding contacts on the next-level circuit board, the so-called "flip-chip" mounting, in which the contacts on the next-level circuit board are of substantially the same size and of the same pitch as are those on the semiconductor chip. Problems arise because the pitch of the semiconductor chip connections is much finer than the pitch attainable on conventional mechanical packages and printed wiring circuit boards to which such semiconductor chips are mounted. In addition, differences in thermal expansion between the semiconductor chip and the next-level circuit board produce thermally-induced stress that leads to failure or degradation of the interconnections when exposed to thermal cycling, which stress is often exacerbated by the rigidity of solder interconnections therebetween.

One solution to these problems employs an intermediate substrate between the semiconductor chip and the next-level circuit board to absorb some of the thermally-induced stress, and also to allow the fanning out of the connections to the semiconductor chip to permit a larger contact size and pitch that is compatible with conventional printed wiring circuit board technology. If the intermediate substrate is substantially larger than the size of the semiconductor chip, then the advantage of small chip size is lost, as is the advantage of short electrical lead length that improves the ability to operate the circuit at very high operating frequencies. While this has been addressed by reducing the size of the intermediate substrate and employing next-level substrate technologies capable of finer line widths and smaller features, the rigidity of the intermediate substrate has again posed some difficulties. Electronic packages where the perimeter of the intermediate substrate is no more than about 20% larger than the perimeter of the semiconductor chip mounted thereon are often referred to as "chip scale packages," although larger packages are often also referred to as "chip scale packages."

The difficulties of rigid intermediate substrates has been addressed by making the substrates of specialized materials that are referred to as being "flexible," such as thin polyimide and other so-called "flexible" conventional substrates on which printed wiring conductors and plated through holes can be formed by conventional methods. But, such substrate materials are not truly flexible in that they do not have a low modulus of elasticity, but only flex to a greater extent because they have been made of thinner material having a high modulus of elasticity. Conventional materials, such as polyimide sheet, have a high modulus of elasticity, e.g., a modulus greater than 70,000 kg/cm$^2$ (1,000,000 psi). In addition, the use of such materials and conventional fabrication methods results in an increased cost that is undesirable and may require assembly processes that are more difficult or expensive to perform.

In addition, enclosed cavity packages are often preferred due to their resistance to the entry of moisture, such as the hermetically-sealed packages usually employed in high reliability, military, aerospace, and medical electronic applications, and in applications of optical devices and frequency-sensitive communication devices. Such packages are generally metal or ceramic with seals formed of glass or metal solders or brazing. The ability of a package to resist the entry of moisture, or to allow the easy exit of moisture, is of importance to reliability of operation. Typically, hermetic type packages are most reliable; lidded packages are less reliable than hermetic packages, but are more reliable than are glob-top, molded or encapsulated packages.

Conventional hermetic cavity type packages are very expensive, due to the metal and/or ceramic package, the slow methods utilized for sealing the rim of the package lid and high labor content. Lidded cavity packages are much less expensive than hermetic packages, but are still expensive as compared to encapsulated packages, such as the molded epoxy or molded plastic encapsulated packages, that are employed in about 95–99% of commercial electronic applications. Even glob-top encapsulated packaging is more expensive than molded packages due to the inherently slow process of dispensing precise amounts of encapsulant, even using precision dispensing equipment. In addition, conductive adhesive connections are unfamiliar to an industry that has long utilized and relied upon solder connections.

Accordingly, there is a need for an electronic substrate or interposer that is suitable for a solder connection, and that avoids some of the technical disadvantage of conventional molded packages without the high cost of conventional hermetic packages. In addition, it would be desirable that such substrate or interposer be suitable for high-density (e.g., chip-scale) packages.

To this end, the flexible dielectric electronic substrate of the present invention comprises a layer of flexible dielectric adhesive having a modulus of elasticity less than about 500,000 psi, having a glass transition temperature less than about 0° C., having the ability to withstand soldering at about 220° C.; and a metal foil on one surface of the layer of flexible dielectric adhesive, wherein the metal foil is patterned to define a pattern of electrical conductors having a plurality of contact sites for receiving the contacts of an electronic device.

Further, a method for making a flexible electronic substrate for receiving an electronic device comprises:

providing a sheet of metal foil;

providing at least one layer of a flexible dielectric adhesive having a modulus of elasticity less than about 500,000 psi on one surface of the sheet of metal foil, the layer of flexible dielectric adhesive having a plurality of via openings therein;

building up conductive material on the metal foil to fill the via openings, thereby forming conductive vias therein;

patterning the metal foil to form a pattern of contacts and conductors electrically connected to the conductive vias in the flexible dielectric adhesive layer; and plating at least one of the conductive vias and the contacts of the patterned metal foil to provide external contacts.

BRIEF DESCRIPTION OF THE DRAWING

The detailed description of the preferred embodiments of the present arrangement will be more easily and better understood when read in conjunction with the FIGURES of the Drawing which include.

DESCRIPTION OF THE PREFERRED EMBODIMENT

A typical conventional electronic package includes a semiconductor chip or die attached to an intermediate laminated substrate, such as an FR4 laminate, by a die attach adhesive. Bond wires, which are fine gold or aluminum wires, connect the contacts of a semiconductor chip to corresponding conductors on a substrate which are in turn connected to conductors on a next-level substrate by connections which may be of solder or electrically-conductive adhesive. The semiconductor chip and bond wires may be protected by a lid or cover, or by a moisture-resistant coating or an encapsulant. Alternatively, the semiconductor chip may be mounted to the substrate in a conventional "flip-chip" manner.

Mechanical stresses arise due to the differences in the coefficients of thermal expansion (CTE) of the different materials utilized in such conventional module and the high moduli of elasticity (ME), i.e. rigidity, thereof. A silicon semiconductor die has a CTE of about 3 ppm/° C., an adhesive has a CTE of about 40 ppm/° C., the substrate has a CTE of about 17 ppm/° C., and an encapsulant has a CTE of about 30 ppm/° C. A silicon semiconductor die has a ME of about 700,000–1,400,000 kg/cm$^2$ (about 10,000,000–20,000,000 psi), the adhesive has a ME of about 70,000 kg/cm$^2$ (about 1,000,000 psi), and the substrate and encapsulant have a ME of about 140,000 kg/cm$^2$ (about 2,000,000 psi). Principally, stress arises in the adhesive and at the interfaces of the adhesive with the chip and the substrate, and to a lesser extent in the encapsulant. The magnitude of the stress depends upon the magnitude of the differences in CTE, the curing temperature of the adhesive and the encapsulant, and the modulus of elasticity of the adhesive and encapsulant.

On the other hand, by employing an intrinsically or molecularly flexible "interposer" or intermediate substrate, the stress build up of the prior art packages is avoided and reliable electronic packages, including chip-scale packages, may be inexpensively made. An intrinsically flexible or molecularly flexible material is a material that is flexible as a result of its molecular structure, and not just because it has been formed into a very thin sheet. Steel, aluminum and glass can be flexed if made thin enough, but none is intrinsically flexible. As used herein, flexible means a material that has a modulus of elasticity that is less than about 35,000 kg/cm$^2$ (500,000 psi) and that withstands an elongation of at least 30% in length without failure. Thus, conventional substrate materials, such as FR4 laminate which has a modulus of elasticity of about 140,000 kg/cm$^2$ (about 2,000,000 psi) and polyimide which has a modulus of elasticity of about 140,000 kg/cm$^2$ (about 2,000,000 psi), and bismaleimide-triazine, are not flexible as that term is used herein.

Figure 1:
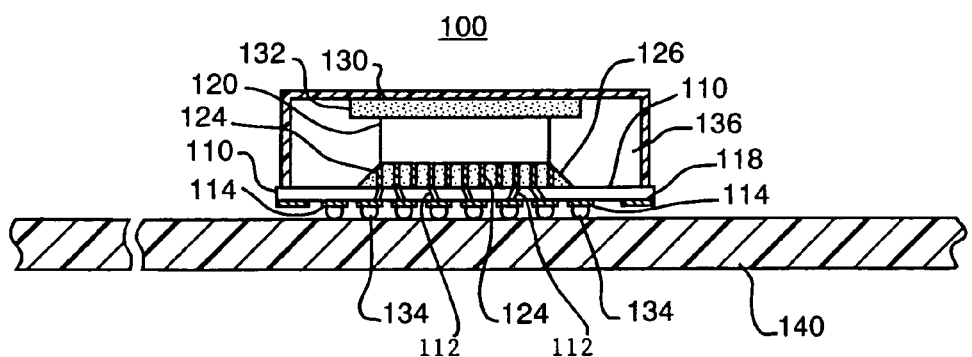
FIGS. 1 and 2 are side cross-sectional schematic diagrams of alternative example embodiments of an electronic package including a substrate according to the present arrangement attached to a next-level substrate.

FIG. 1 is a side cross-sectional schematic diagram of an example embodiment of an electronic package 100 having a substrate 110 according to the present arrangement attached to a next-level substrate 140. Package 100 includes a flexible interposer 110 which is a substrate upon which an electronic device, for example, semiconductor chip 120, is attached. Contacts on the bottom face of chip 120 are directly connected to contacts 112 of interposer 110 by interconnections 124, which may be of solder or an electrically-conductive flexible adhesive. Where support for chip 120 in addition to that provided by connections 124 is desired, flexible dielectric underfill adhesive 126 is employed to fill the volume between chip 120 and interposer 110 that is not filled by flexible connections 124. Solderable contacts 114 on interposer 110 correspond to contacts 112 on the opposing surface thereof, and provide contacts for connections 134 between package 100 and conductors on next-level circuit substrate 140. Connections 134 may be conventional solder connections or electrically-conductive adhesive as in a ball grid array (BGA) package, and an underfill material is not required between package 100 and next-level substrate 140.

Preferably, flexible adhesive interposer 110 comprises a layer of flexible dielectric adhesive on a sheet of metal foil, such as a copper, copper alloy. nickel, aluminum or other electrically-conductive metal or an alloy thereof, that is subsequently etched to define the pattern of contacts 114. Via holes in the flexible dielectric layer are filled with flexible electrically conductive adhesive to provide electrical connection to contacts 112. The flexible adhesives of interposer 110 have a modulus of elasticity that is less than about 35,000 kg/cm$^2$ (about 500,000 psi), and preferably is less than about 14,000 kg/cm$^2$ (about 200,000 psi), and more preferably is about about 7,000 kg/cm$^2$ (about 100,000 psi), and most preferably is about 1,400 kg/cm$^2$ (about 20,000 psi). In addition, such flexible adhesives are able to withstand the high temperature to which they will be subjected by soldering operations, e.g., the 220° C. melting temperature of solder. Preferably, the flexible adhesive can withstand a temperature of up to 300° C. for 1–2 minutes without change of shape, dimension or mechanical strength.

Suitable flexible dielectric adhesives include, for example, types CC7450, ESP7450, ESP7550, ESP7670 and ESP7675 screen-printable flexible thermosetting dielectric adhesives and type UVS7450 photo-etchable flexible thermosetting dielectric adhesive, all of which have a modulus of elasticity of about 1,400 kg/cm$^2$ (about 20,000 psi) and a CTE of about 100 ppm/° C., and are available from AI Technology, Inc., located in Princeton, N.J. Suitable flexible electrically-conductive adhesives that may be employed to fill via holes in the dielectric layer of interposer 110 or to form connections 124 include types ESP8350, ESP8450, ESS8450, ESS8459, and ESP8550 flexible electrically-conductive thermosetting adhesive also available from AI Technology, Inc. Flexible interposer 110 and the making thereof is described in detail herein below.

It is noted that, because flexible adhesive interposer 110 is molecularly flexible, and because flexible conductors 112 thereof are solderable, interconnections 124 and/or 134 may preferably be metal solder connections such as are known and in widespread use in the flip chip mounting of electrical devices.

Lid or cover 130 is attached to interposer 110 by an adhesive to enclose chip 120 and provide mechanical protection therefor. Where additional mechanical support is desired, a flexible adhesive pad 132 may be employed to join the inner surface of lid 130 to the upper face of chip 120. Lid 130 may be plastic, glass, ceramic or metal, as desired. Where it is desired to remove heat from chip 120, lid 130 may be made of a thermally conductive material, such as copper, brass, steel or aluminum, and flexible adhesive 132 may include thermally-conductive particles to provide a thermal connection between chip 120 and lid 130 from whence heat may be dissipated. Where it is desired that light be permitted to pass through lid 130 and impinge upon chip 120, lid 130 or at least the top thereof may be optically transparent to light of the desired wavelength(s). In addition, an optional metallic rim 118 may be provided on flexible adhesive interposer 110 to stiffen interposer 110 in the peripheral region thereof where lid 130 is attached.

It is also noted that the flexible adhesive bumps and the solder bumps of package 100 that form respective connections 124 may be deposited onto or otherwise applied to chip 120, either at the semiconductor die level or at the semiconductor wafer level, before chip 120 is attached to flexible adhesive interposer 110, or may be applied to contacts 112 of interposer 110.

Figure 2:
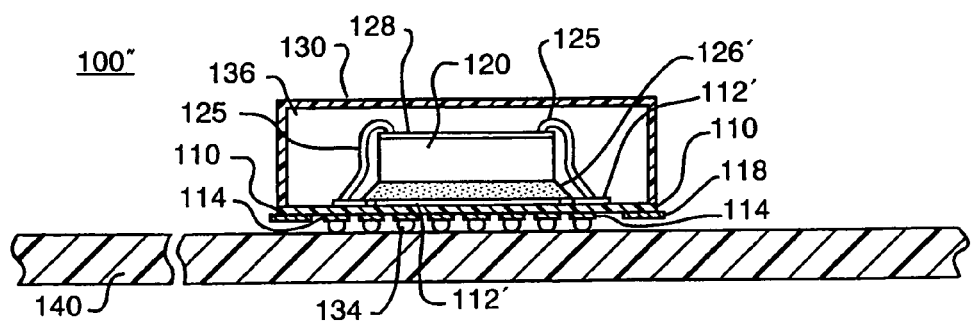

FIG. 2 is a side cross-sectional schematic diagram of an alternative example embodiment of an electronic package 100" according to the present arrangement attached to a next-level substrate 140. Package 100", like package 100, includes flexible interposer 110, and electronic device or chip 120 attached thereto, but with contacts on chip 120 connected to contacts 112' of interposer 110 by bond wires 125. Bond wires 124 are preferably fine gold or aluminum wires, such as are known and in widespread use in electrical devices. Contacts 112 may be formed of standard lead-frame metals, such as copper, nickel or kovar alloy, which and may also form a die-attach pedestal under chip 120 as well. Chip 120 is attached to flexible adhesive interposer 110 by a flexible or a rigid die-attach adhesive 126'. Interposer contacts 114 provide contacts for BGA solder or conductive adhesive connections 134 between package 100" and conductors on next-level circuit substrate 140; without underfill. Lid 130 attached to interposer 110 provides mechanical protection for chip 120. An optional flexible adhesive pad 132 may be employed to provide added mechanical support and covering for chip 120, and optional metallic rim 118 may be provided for stiffening, all as described above.

It is noted that because flexible adhesive interposer 110 of packages 100, 100" of FIGS. 1–2 is molecularly flexible as defined above, one or both of connections 124 and connections 134 may be metal solder connections such as the so-called "C$^{4}$" solder connections known and in widespread use in the flip chip mounting of electrical devices, without thermally-induced stresses jeopardizing the integrity and reliability of the electrical connections they provide, despite the very rigid nature of the solder, e.g., a modulus of elasticity of about of about 700,000 kg/cm$^2$ (about 10,000,000 psi) and a CTE of about 20–25 ppm/° C.

Where the flexible interposer 110 of the packages 100, 100" of FIGS. 1–2 allows moisture to enter into the volume of cavity 136 defined by lid 130, chip 120 and flexible interposer 110, moisture will also exit cavity 136 with relative ease, however, if moisture is present within cavity 136 and the temperature were to drop, then moisture may condense on the surfaces of interposer 110, chip 120 and lid 130 within cavity 136. The presence of such condensed moisture could lead to corrosion or oxidation of certain materials such as the metals of which various conductors and contacts are formed. Such condensation is most likely to occur while chip 120 is not being operated, e.g., while it is unpowered. When chip 120 is powered, it is likely that the heat generated thereby will raise the temperature of chip 120 and so avoid condensation on chip 120. Thus, condensation is likely to be only intermittent at worst and to occur during an unpowered condition.

Where semiconductor chip 120 is attached to flexible adhesive interposer 110 in a flip-chip arrangement as in FIG. 1, for example, dielectric adhesive underfill 126 protects the contacts of chip 120 and flexible adhesive interposer 110 against condensation. In addition, where moisture is expected to enter cavity 136, it is preferred that the dielectric adhesive of underfill 126 be hydrophobic to further diminish the possibility of condensation forming on the contacts of chip 120 and flexible adhesive interposer 110. Similarly, where semiconductor chip 120 is mounted for wire-bond connections as in FIG. 2, the contacts of chip 120 are exposed and chip 120 may be covered with a suitable protective coating 128, preferably a flexible hydrophobic coating, to reduce the possibility of corrosion. Suitable hydrophobic adhesives for such underfill and coating include types CP7135, CP7130 and ESP7450 flexible hydrophobic dielectric adhesives available from AI Technology, Inc., in which the carrier medium is typically a non-polar hydrophobic polymer.

It is also noted that where lid 130 includes a pre-applied adhesive around the edges thereof that adhesively attach to flexible adhesive interposer 110, packages 100, 100" may be assembled in an in-line process, such as by standard pick-and-place component mounting equipment. While such lids 130 may be provided in several ways including by dispensing adhesive onto each lid or cover, or by applying an adhesive preform to each lid or cover, adhesive preform lids and covers as described in U.S. Pat. No. 6,136,128 (U.S. patent application Ser. No. 09/232,936 filed Jan. 19, 1999) entitled "Method Of Making An Adhesive Preform Lid, As For An Electronic Device" and laminated adhesive lids and covers as described in U.S. Pat. No. 6,409,859 (U.S. patent application Ser. No. 09/337,453 filed Jun. 21, 1999) entitled "Method Of Making A Laminated Adhesive Lid, As For An Electronic Device" which are expressly incorporated herein by reference in their entireties, are well suited to packages 100, and 100". With such low cost lids and covers and in-line processing, the cost of packages according to the present arrangement could be comparable to the cost of glob-top and molded encapsulation packages.

Figure 3A:
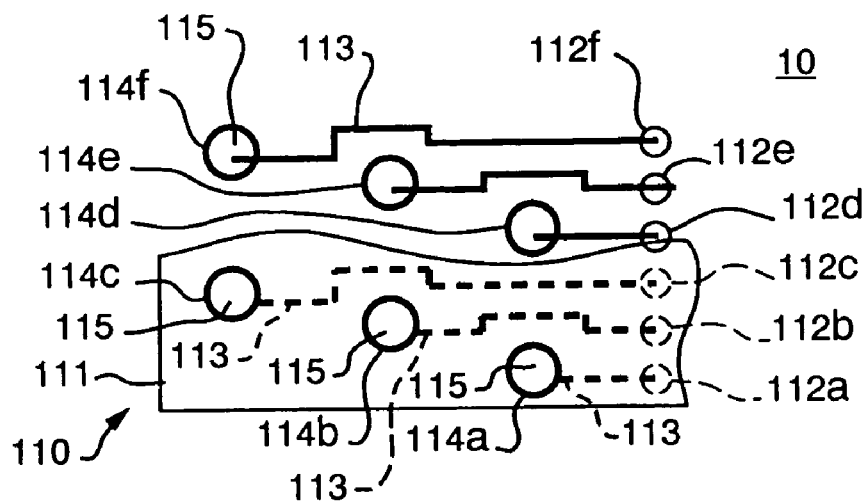
FIGS. 3A and 3B are schematic diagrams of example "fan-out" contact patterns useful with an interposer in the embodiments of FIGS. 1–2.
Figure 3B:
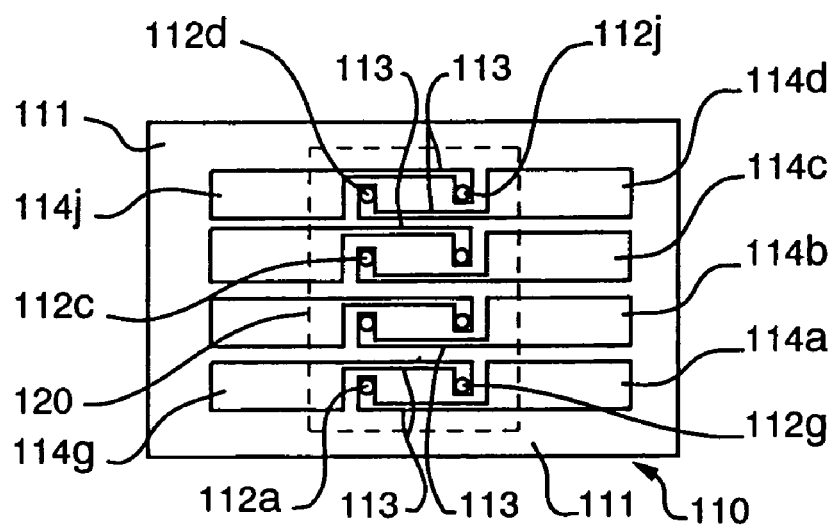

FIGS. 3A and 3B are schematic diagrammatic illustrations of example "fan-out" patterns useful with a flexible adhesive interposer 110 (shown in part) of the embodiments of FIGS. 1–2. Semiconductor chip 120 is fabricated by conventional methods that permit very fine features to be formed therein, e.g., dimensions of about 1 μm and larger, including very small size electrical conductors and contacts that are also very closely spaced. But such features are too fine to be compatible with typical low-cost conventional next-level substrates 140, such as FR4 printed wiring circuit boards, which typically have features of at least 50 μm (about 2 mils) and larger. Because the pattern of contacts 112 of flexible adhesive interposer 110 that correspond to the pattern of contacts of semiconductor chip 120 need not be the same pattern as the pattern of contacts 114 of flexible adhesive interposer 110 that correspond to a pattern of contacts on next-level substrate 140, a fan-out arrangement of contacts 112, 114 and conductors 113 may be employed to space apart contacts 112 and 114 that complete connections between contacts on semiconductor chip 120 and those on next-level substrate 140, respectively.

In FIG. 3A, for example, contacts 112a–112f to which contacts of semiconductor chip 120 attach may be 50 μm (about 2 mils) in diameter and at a pitch (center-to-center spacing) of 100 μm (about 4 mils), and are on a first surface of flexible adhesive layer 111 of interposer 110, which layer 111 is shown partially removed. Contacts 114a–114f to which contacts of next-level substrate 140 attach may be 100 μm (about 4 mils) in diameter and at a pitch (center-to-center spacing) of 300 μm (about 12 mils), and are on a second and opposing surface of flexible adhesive layer 111 of interposer 110. Conductors 113 connect corresponding ones of contacts 112 and 114, e.g., connect contacts 112a and 114a, connect 112b and 114b, and so forth, and may be quite fine, e.g., about 25–50 μm wide, and of varying length to further space contacts 114 apart. Conductors 113 are in a sequence of lengths to remove contact 114a from contact 112a by about 0.5 mm (about 20 mils), contact 114b from contact 112b by about 1 mm (about 40 mils) and contact 114c from contact 112c by about 1.5 mm (about 60 mils). Flexible conductive adhesive vias 115 through flexible adhesive layer 111 can be much smaller than contacts 114, e.g., about 50 μm (about 2 mils) in diameter.

Although conductors 113 are shown in FIG. 3A as being on the far surface of flexible adhesive layer 111 and connecting to contacts 114 through flexible conductive adhesive vias 115, conductors 113 could be on the near surface of flexible adhesive layer 111 and connect to contacts 112 through conductive vias thereat. Flexible adhesive layer 111 is resistant to the solvents and other chemicals used in forming conductors 113, contacts 114 and flexible conductive adhesive vias 115 thereon. In addition, it is noted that the locations of contacts 114 on interposer 110 may be outside the periphery of semiconductor chip 120, as illustrated, may be within the periphery of chip 120, or may be both outside and within the periphery of chip 120, i.e. at any location on flexible adhesive interposer 114.

In FIG. 3B, for example, an alternative fan-out arrangement not only expands the size and spacing of contacts 114 with respect to contacts 112 as in FIG. 3A, but also provides for contacts 112 and 114 to be in mirror image patterns, as is particularly useful where a semiconductor chip that was mounted in the manner of FIG. 2 is to be utilized in a package of the sort of FIG. 1 in which it is to be mounted in a flip-chip manner which reverses the pattern of its contacts, for example, as viewed from the direction of next-level substrate 140. This reversal is removed by the pattern of conductors 113 which connect contacts 112 on the leftward edge of semiconductor chip 120 (shown in phantom) with the corresponding contacts 114 on the rightward portion of interposer 110, and also connect contacts 112 on the rightward edge of semiconductor chip 120 with the corresponding contacts 114 on the leftward portion of interposer 110. In the example of FIG. 3B, contacts 114 are large and rectangular, as might be useful where contacts 114 are to come into electrical contact with external conductors, as in a contact-type card or tag as could be employed for ingress/egress access, identification of personnel or equipment or other objects, credit, debit and telephone cards, and the like.

Among the additional advantages of the foregoing packages 100, 100" are that they employ materials that are readily available at reasonable cost and may be fabricated utilizing standard "pick-and-place" equipment to attach semiconductor chips 120 and lids 130, for example, on an inherently fast, assembly-line arrangement, and so inherently offer the advantage of low cost, e.g., no more than two times the cost of the lowest cost conventional molded electronic packages.

Alternatively, cavity 136 of packages 100, 100" may be substantially filled with encapsulant 137. In these cases, lid or cover 130 may be utilized as an encapsulating form or mold and then may remain or be removed, or cover 130 may be eliminated and an encapsulating mold used. It is noted that the equipment and other infrastructure for molding encapsulant around electronic devices is known and available and so is easily utilized in relation to the present arrangement at low cost. Molding may be performed for "strips" and continuous reels having a series of electronic devices in a line thereon (one-dimensional arrays) or "panels" or wide continuous reels having a fixed number of electronic devices across the width thereof (two-dimensional arrays), similar to molding of conventional lead-frame packages. Depositing and finishing of solder balls 134 may likewise be performed on such one-and two-dimensional arrays of devices. The strips, continuous reel, panel or other arrangement may employ alignment holes therein for proper positioning of the various features of packages 100, 100' and 100". Further, the resistance of the molded package to the entry of moisture is likewise known, and may be improved by the fact that moisture may escape through the flexible adhesive of interposer 110, which would reduce the effect of expansion of trapped moisture due to heating during soldering of surface mount technology (SMT) packages, sometimes referred to as the "pop-corn" effect. Where semiconductor chip 120 is mounted in a flip-chip manner, an electrically-conductive hydrophobic flexible is preferred for connections between chip 120 and interposer 110 so as to further resist moisture, and a hydrophobic adhesive underfill 126 is likewise preferably a hydrophobic adhesive.

Suitable materials for encapsulant 137 include standard rigid encapsulants, such as known epoxy and liquid epoxy compounds utilized for molded and glob-top encapsulation, that have a CTE of about 30 ppm/° C. or less and a high modulus of elasticity, e.g., about 140,000 kg/cm$^2$ (about 2,000,000 psi), and flexible adhesive encapsulants, such as the flexible dielectric adhesives identified above.

Figure 4:
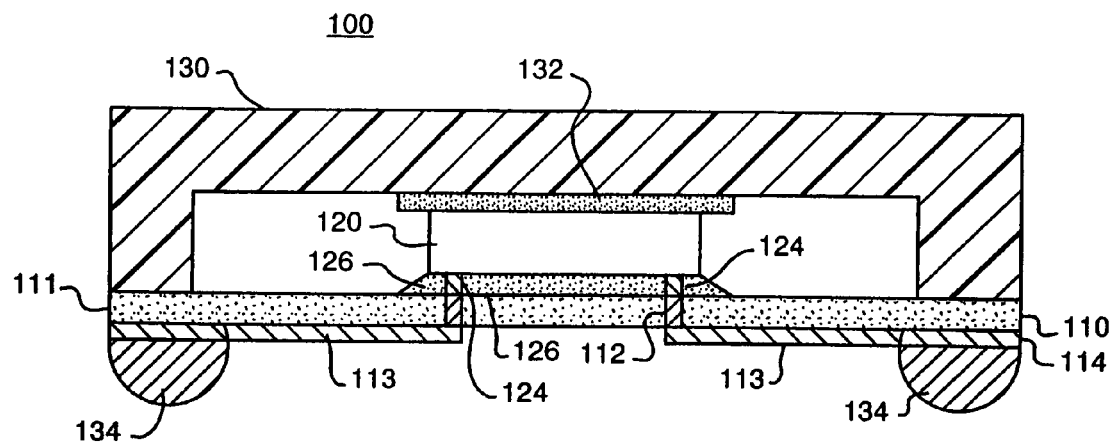
FIG. 4 is a side cross-sectional schematic diagram showing additional detail of the example embodiment of an electronic package according to the present arrangement as shown in FIG. 1.

FIG. 4 is a side cross-sectional schematic diagram showing additional detail of the example embodiment of an electronic package similar to package 100 of FIG. 1. Electronic device (chip or die) 120 is mounted to flexible adhesive interposer 110 in a flip-chip manner by connections 124, which may be solder connections or flexible electrically-conductive adhesive, and optional flexible dielectric underfill adhesive 126. Flexible adhesive interposer 110 comprises flexible adhesive layer 111 and a metal layer providing conductors 113 thereon. Flexible adhesive layer 111 has via holes therethrough in which are conductive vias 112 which are a flexible electrically-conductive adhesive of like flexibility (i.e. modulus of elasticity) to that of flexible dielectric adhesive layer 111. The metal layer is patterned, such as by photo etching or printing, to provide conductors 113 between conductive vias 112 and metal contacts 114 on which are formed solder ball or solder bump contacts 134.

In an example form of package 100 of FIG. 4, chip 120 may be about 25–500 µm (about 1–20 mils) thick, and more typically about 250–500 µm (about 10–20 mils) thick, and flexible adhesive layer 111 is about 75–250 µm (about 3–10 mils) thick with about 50–250 µm (about 2–10 mils) thick copper conductors 113 and contacts 114 thereon. Suitable flexible dielectric adhesives for interposer 110 include types CC7450, ESP7450, ESP7550, ESP7670 and ESP7675 flexible thermosetting adhesives and type UVS7450 flexible thermosetting adhesive, which is suitable for use with conventional UV photoresist and photo-etching chemicals and solvents, each of which is a polymer adhesive available from AI Technology, Inc. located in Princeton, N.J., or other suitable flexible adhesive, and each of which has suitable properties, such as low dielectric constant, low dielectric loss, good temperature stability, low sensitivity to moisture and the like. Conductive vias 112 of flexible electrically conductive adhesive are about 50–100 µm (about 2–4 mils) in diameter, as are conductive connections 124. Suitable electrically-conductive adhesives for connections 124 include type PSS8150 SOLDER-SUB® flexible thermoplastic adhesive or type ESS8450 SOLDER-SUB® adhesive, as well as types ESP8350, ESP8450, ESS8459, and ESP8550, each of which is a thermosetting electrically-conductive polymer adhesive also available from AI Technology, Inc., or other suitable flexible conductive adhesive, which desirably reduces the thermally-induced stress due to the temperature of the package, both in processing, such as in soldering solder connections 134, and in operation whether due to environment and power dissipation of chip 120. Suitable underfill adhesive 126 includes type MEE7650-5 flexible dielectric polymer adhesive, as well as types CP7135, CP7130 and ESP7450 flexible dielectric adhesives, all also available from AI Technology. Solder bumps 124 and/or 134 are about 125–250 µm (about 5–10 mils) in diameter and somewhat less in height after being reflowed. Lid 130 is typically about 0.5–0.75 mm (about 20–30 mils) thick and may be attached to flexible adhesive interposer 110 with the same adhesive as is employed for adhesive underfill 126, for example. Optional adhesive interface 132 may be a dielectric adhesive such as type ESP7450 or type ESP7670 where additional mechanical support is desired, or may be an electrically conductive adhesive such as type PSS8150 SOLDER-SUB® adhesive or type ESS8450 SOLDER-SUB® adhesive where an electrical connection between chip 120 and cover 130 is also desired, or may be a thermally-conductive adhesive such as types ESP7455 and ESP7675 thermally conductive dielectric thermosetting adhesives also available from AI Technology. Lid 130 may be plastic or metal, and preferably is metal where either electrical conduction or thermal conduction through lid 130 is desired, unless an electrically-conductive or thermally-conductive plastic is suitable.

Figure 5:
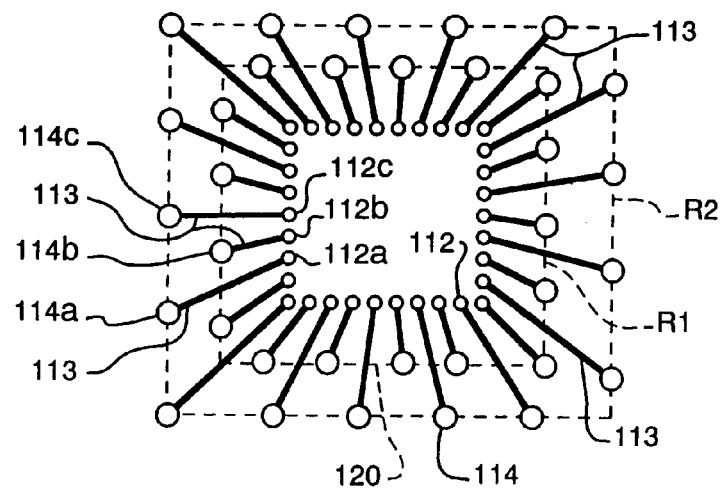
FIGS. 5 and 6 are schematic diagrams of example fan-out contact patterns useful with an interposer in the embodiment of FIG. 4, as well as those of FIGS. 1–2.

It is noted that flexible adhesive interposer 110 is well suited for fan out between the contacts of chip 120 and those of a next-level substrate 140, as illustrated in FIG. 4 by the spacing of the contacts of semiconductor chip 120 and thus of ones of connections 124 and conductive vias 112 being closer than is the spacing of ones of contacts 114 and solder bumps 134, as in a ball-grid-array (BGA) device. FIG. 5 is a schematic diagram of an example fan-out contact pattern useful with a flexible adhesive interposer 110 in the embodiment of FIG. 4, as well as in the embodiments of FIGS. 1–2, and may accommodate standard, conventional or non-standard contact patterns. For example, FIG. 5 illustrates a chip 120 (shown in phantom) having its contacts located around the periphery thereof attaching to conductive vias 112, e.g., 112a, 112b, and so forth, which are connected by conductors 113 to corresponding contacts 114, e.g., 114a, 114b, and so forth, respectively, located on two concentric rectangular patterns or arrays R1 and R2 of contacts. Conductive vias 112 may be about 75 µm (about 3 mils) in diameter and at a 150 µm (about 6-mil) pitch and connect to corresponding contacts 114 through 75 µm (about 3-mil) wide conductors 113. Contacts 114 may be about 125–250 µm (about 5–10 mils) in diameter and at a 1 mm (about 40-mil) pitch with respect to conductors 113 if on pattern R1 and at a 2 mm (about 80-mil) or greater pitch if on pattern R2.

Figure 6:
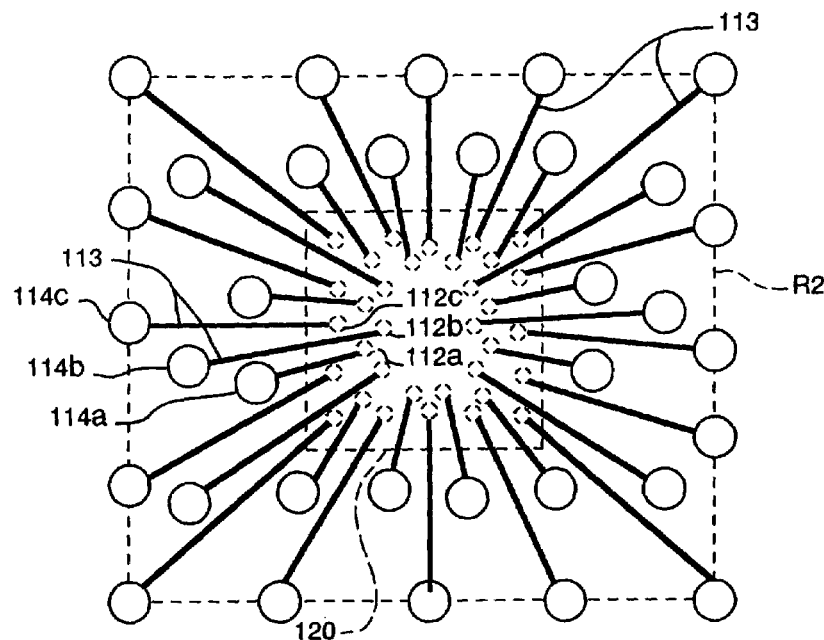

Similarly, FIG. 6 illustrates a semiconductor chip 120 (shown in phantom) having contacts located in a two dimensional or "area array" of positions, which may be a regular or an arbitrary or irregular array of positions, at which are conductive vias 112 that are connected by conductors 113 to an array of contacts 114 located in another two dimensional or area array of positions, which may be a regular array or may be an arbitrary or irregular array of positions. Typical dimensions thereof may be the same as or similar to those above in relation to FIG. 5. It is noted that the locations of contacts 114 on interposer 110 may be outside the periphery of semiconductor chip 120, as illustrated, may be within the periphery of chip 120, or may be both outside and within the periphery of chip 120, i.e. at any location on flexible adhesive interposer 114.

In addition to the advantages of electronic packages 100 and 100" employing flexible adhesive interposer or substrate 110 as described above, flexible adhesive interposer 110 is made by methods that advantageously avoid many of the costly operations associated with the manufacture of conventional printed circuit wiring boards, such as the drilling of through holes in the substrate and the formation of plated-through conductor holes in the substrate material, the separate manufacture of plural different printed circuit wiring boards that must be laminated together to form a plural-layer printed circuit board, and the like.

Moreover, flexible adhesive interposer 110 is truly flexible because the adhesive employed therein is molecularly flexible, i.e. it has a low modulus of elasticity, and not just because it is thin as is the case with conventional so-called flexible substrate materials. As a result, flexible adhesive interposer 110 may be formed employing methods that permit very fine contacts and conductors at very close spacing, i.e. fine pitch. Further, flexible conductive adhesive vias 112 therein can withstand soldering temperature and are coated with a solderable material so as to be compatible with conventional solder ball connection processing, in particular, flip-chip processing. In addition, flexible interposers according to the present arrangement may be formed and/or applied to semiconductor devices at the semiconductor wafer level to remain with the individual devices when the wafer is singulated to produce plural semiconductor devices, thereby providing an additional saving of time and cost.

Typically, the flexible adhesive interposer according to the present arrangement may be made as follows. A thin metal sheet or foil is provided from which contacts on one side of interposer 110 are formed. The metal foil may be copper or copper alloy (such as beryllium copper), nickel or nickel alloy, aluminum or aluminum alloy, or other suitable electrically-conductive metal, and preferably is an about 12.5–125 µm (about 0.5–5 mils) thick copper-based alloy, with a thickness of about 25–50 µm (about 1–2 mils) being typical. The surface of the metal foil may be prepared to improve the adhesion of an adhesive thereto, such as by abrasion or etching such as chemical or plasma etching or other suitable method. The metal foil should be patternable, such as by etching, and the desired pattern in photoresist or other suitable pattern-defining material may be applied to the metal foil at this stage. Preferably, the metal foil may also be coated with a solderable material or a pattern thereof, such as one of the coatings described below.

A pattern of bumps of flexible conductive adhesive is deposited onto the metal foil. The pattern of bumps corresponds to the pattern of contacts of the semiconductor device to which they will connect, and may be deposited, for example, in paste form by dispensing, screen printing, stenciling, ink-jet printing or any other suitable method. The flexible conductive adhesive bumps are then dried, B-staged or cured. Preferred flexible conductive adhesives include types ESP8350, ESP8450, ESP8550, ESS8450, and ESS8459 which are thermosetting flexible conductive adhesives available from AI Technology that can withstand the high temperatures utilized in soldering. Where the semiconductor device is of small size (e.g., less than 5 mm by 5 mm) so that the conductive vias do not need to be flexible, a more rigid conductive adhesive such as AI Technology type ESP8680 may be utilized. While the foregoing example adhesives are thermosetting adhesives, thermoplastic adhesives that can withstand soldering temperature may also be utilized.

A layer of flexible adhesive 111 is deposited on the metal foil, such as by screen printing, stenciling, paste draw down, or other suitable method, typically having a thickness of about 50–250 µm (about 2–10 mils), but preferably a thickness the same as the height of the conductive bumps or slightly less. Adhesive layer 111 has via holes therethrough defined by the screen, stencil or other printing process or other suitable method, in locations corresponding to the locations of the bumps of flexible conductive adhesive previously deposited. Via holes typically have the same diameter as the conductive adhesive bumps, e.g., about 100 µm (about 4 mils) or larger, and are sized so that the flexible dielectric adhesive will touch the conductive adhesive bumps. Relational alignment holes are also preferably formed in the printing screen and/or stencils to provide for alignment of the patterns of flexible adhesive relative to the stencils, screens, masks and other layers typically utilized in later processing operations, such as etching and other masked operations.

Alternatively, the layer of flexible adhesive 111 may be deposited on the metal foil prior to the formation of the conductive adhesive bumps thereon, such as by screen printing, stenciling, paste draw down, or by laminating a sheet of dried or B-staged adhesive thereto, or other suitable method, typically having a thickness of about 50–250 µm (about 2–10 mils). In this case, adhesive layer 111 has via holes therethrough defined by the screen, stencil or other printing process or formed by laser drilling, mechanical drilling, mechanical punching, die cutting, photo-etching, plasma etching or other suitable method, in locations corresponding to the locations of the contacts of the semiconductor chip 120 to be attached to interposer 110. Mechanical punching, die cutting and screen printing are preferably employed to form via holes having a diameter of about 100 µm (about 4 mils) or larger, and printing, photo-etching, plasma etching and laser drilling are preferably employed to form via holes having a diameter less than about 100 µm (about 4 mils). Such via hole formation by mechanical means is preferably done in sheets or films of dried or B-staged flexible adhesives prior to their being laminated to the metal foil, and relational alignment holes are also preferably formed therein to provide for alignment of the sheet of flexible adhesive relative to the stencils, screens, masks and other layers typically utilized in later processing operations, such as etching and other masked operations. Where the via holes are formed by plasma etching of flexible adhesive layer 111, the metal etch-defining mask may be temporarily attached to, but kept separated from, the flexible adhesive layer 111 by a thin layer of grease or a suitable low temperature adhesive, such as type MB7060 low-melt-flow temperature adhesive available from AI Technology which releases at a temperature of about 60° C. The separation provided by the grease or low-temperature adhesive is beneficial to reduce or avoid heating flexible adhesive layer 111 caused by either the plasma etching or by heating the temporary adhesive to remove of the metal etching mask, which heating of flexible adhesive layer 111 could undesirably cause curing or partial curing thereof.

Where the adhesive layer 111 is formed first, and after it is dried, B-staged or cures, as appropriate, the via holes therein are filled with flexible conductive adhesive is deposited, for example, in paste form by dispensing, screen printing, stenciling, ink-jet printing or any other suitable method. The flexible conductive adhesive bumps are sized so as to come into contact with the sides of the via holes in dielectric layer 111 and are then dried, B-staged or cured.

Preferred flexible adhesives for layer 111 of flexible adhesive interposer include the types identified above which have the characteristics and properties set forth in the table below:

| Characteristic or Parameter | Limit Value | ESP7450 Adhesive | UVS7450 Adhesive |
|---|---|---|---|
| Dielectric Constant | <6.0 | <4.0 | <4.0 |
| Dielectric Loss | <0.1 @ >60 Hz. | <0.05 | <0.05 |
| Dielectric Strength | >19,700 V/mm (>500 V/mil) | >29,600 V/mm (>750 V/mil) | >29,600 V/mm (>750 V/mil) |
| Modulus of Elasticity | <70,000 kg/cm$^2$ (<500,000 psi) | 1,400 kg/cm$^2$ (20,000 psi) | 1,400 kg/cm$^2$ (20,000 psi) |
| Elongation Before Failure | >30% | 100% @ 25° C. | 100% @ 25° C. |

-continued

| Characteristic or Parameter | Limit Value | ESP7450 Adhesive | UVS7450 Adhesive |
|---|---|---|---|
| Glass Transition Temperature | <0° C. | < −20° C. | < −20° C. |
| Adhesion to Copper (ASTM #D1894) | >1.07 dyne/cm (>6.0 lb/in.) | >1.43 dyne/cm (>8.0 lb/in.) | >1.43 dyne/cm (>8.0 lb/in.) |
| Moisture Absorption | <0.5% | <0.5% | <0.5% |
| Chemical Resistance (copper-etching solutions) | Pass | Passes, soaking for 8 hours | Pass, soaking for 8 hours |
| Solvent Resistance (flux cleaning operations) | Pass | Passes, soaking for 8 hours | Pass, soaking for 8 hours |
| Thermal Stability and Degradation TGA | <10% weight loss @ >300° C. | <10% weight loss @ >400° C. | <10% weight loss @ >400° C. |
| Coefficient of Thermal Expansion | | 100 ppm/° C. | 100 ppm/° C. |

Although a dielectric strength of about 19,700 V/mm (about 500 V/mil) is preferred, only about 11,800 V/mm (about 300 V/mil) is necessary for operability. The flexible conductive adhesive typically exhibits similar mechanical properties, but is electrically conductive due to the presence of suitable amounts of conductive particles therein, for example, spheres, flakes or other shapes of silver, gold, palladium, platinum, or other metal or a combination or alloy thereof, in solid form or plated onto a core.

After adhesive layer 111 and conductive vias 112 are B-staged and/or cured sufficiently (i.e. partially or fully), they remain attached to the metal foil and are unaffected by (1) the etching chemicals and solvents utilized thereafter, whether acidic or basic, to etch the pattern of conductors 113 and contacts 114 into the metal foil, and to apply, develop and strip the photo-resists utilized to define the patterns to be etched in the metal foil, and (2) the plating of solderable metal onto metal foil 113 and onto flexible conductive adhesive vias 112.

It is preferred that the flexible dielectric adhesive of layer 111 and the electrically-conductive flexible adhesive of vias 112 have respective moduli of elasticity that are in the same range. For example, the modulus of elasticity of either one of the adhesives preferably does not exceed three to five times the modulus of elasticity of the other one of the adhesives. Any spillage or excess of conductive adhesive on the surface of dielectric adhesive layer 111 outside of via conductors 112 is wiped off. Flexible conductive adhesives such as types PSS8150, ESP8450 and ESP8550 thermosetting adhesives, all available from AI Technology, do not affect the types ESP7450 and UVS7450 thermosetting dielectric adhesives utilized for dielectric layer 111. It is preferred that the exposed metal of metal layer 113 at the bottoms of the via holes be coated e.g., by plating, with a suitable oxidation-resistant metal, such as gold, nickel-gold, palladium, platinum, nickel-palladium and the like, prior to filing the via holes with conductive adhesive. It is noted that the metal foil layer 113 may be patterned either before or after the forming of the conductive vias 112 where dielectric layer 111 is applied prior thereto.

Patterning of the metal foil layer 113 is by conventional photo-etching processes to create either contacts 114 overlying conductive vias 112, contacts 114 displaced from conductive vias 112 and joined thereto by conductors 113, or both. Because at least an about 2:1 ratio of the width of an etched feature to the thickness of the metal foil is typically desired, thinner metal foils 113 permit finer contacts and conductors to be obtained. For example, about 50 μm (about 2 mil) wide features and pitch may be obtained with a 25 μm (about 1 mil) thick copper foil. A coating 113a may be applied metal foil 113 and conductive vias 112, such as a layer of silver, gold, palladium, platinum, nickel-gold, nickel-palladium, or other precious metal, or other combinations or alloys thereof, such as by plating, to reduce oxidation, metal migration, and/or inter-metallic degradation. Nickel-gold or gold and nickel-palladium plated coating are preferred for conductive vias 112 and contacts 114, with a thickness of about 5 μm nickel covered by a thickness of about 0.1 μm gold or palladium. Alternatively, metal layer 113 may be patterned after interposer 110 is attached to a next-level substrate such as a semiconductor wafer, as described below.

After the patterning of contacts 114 and conductors 113, conductors 113 may optionally be covered by a layer of flexible dielectric adhesive to prevent unintended electrical contact thereto, e.g., such as by solder bridging. The flexible dielectric adhesive may be the same adhesive employed for flexible adhesive layer 111 or may be another type, such as a flexible photo-polymer that can be patterned and partially removed. The pattern of contacts 114 are conveniently not covered where such flexible dielectric adhesive is deposited by screen printing, stenciling or other method allowing for patterned deposition. Although in many cases the patterns of contacts on electronic device 120 and on next-level substrate 140 are predetermined and so the pattern of conductive vias 112, contacts 114, conductors 113 must be adapted thereto, the arrangement of contacts 114 and conductors 113 may simplified where there is the ability to define the respective patterns of contacts on electronic device 120 and on next-level substrate 140.

Interposer 110 is then laminated to a semiconductor wafer or semiconductor device, i.e. interposer 110 is placed against such wafer or device with the plated ends 112a, 112b, . . . of conductive vias 112 against the contacts of such wafer or device and connected thereto by solder or conductive adhesive connections 124. If it is desired to provide additional strength to the mounting of the semiconductor wafer or device to interposer, or to protect the connections therebetween against moisture or other foreign matter, the space between interposer 110 and the semiconductor wafer or electronic device may be filled with an underfill adhesive. Type MEE7650-5 flexible thermosetting adhesive available from AI Technology is suitable for such underfill. The flexible thermosetting adhesives utilized for dielectric layer 111 and for conductive vias 112 are cured fully before the semiconductor wafer is separated into individual semiconductor devices. The preferred adhesives are cured at a suitable combination of temperature and time, typically for about 0.01 to 24 hours at a temperature between about 80° C. and 250° C.

Figure 7A:
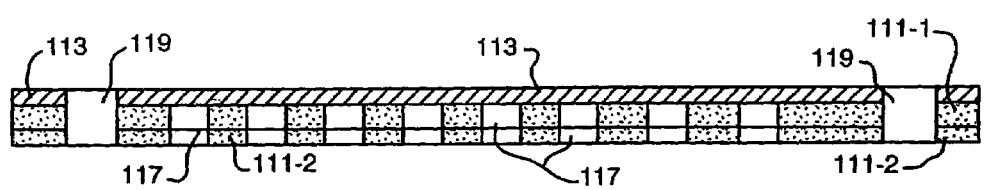
FIGS. 7A, 7B and 7C are side cross-sectional schematic diagrams illustrating the fabrication of an interposer of the sort described in relation to FIGS. 1–6.
Figure 7B:
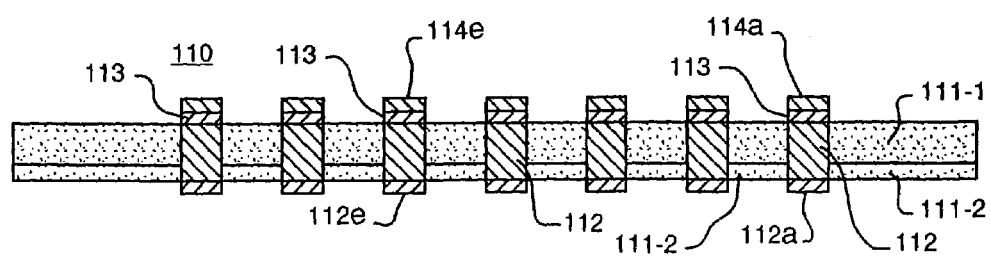
Figure 7C:
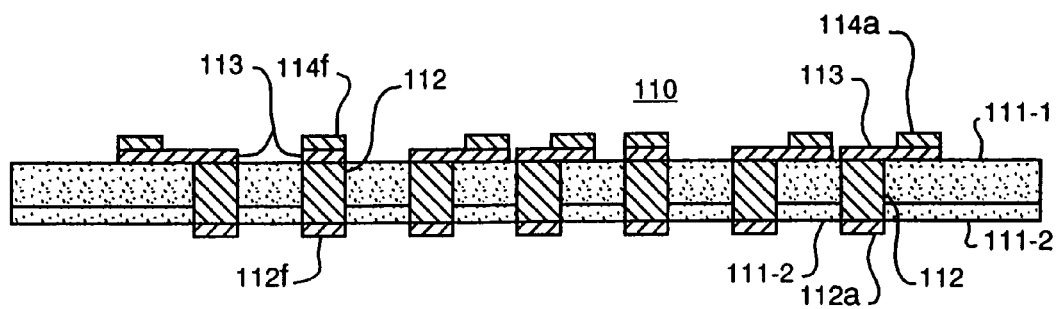
Figure 7D:
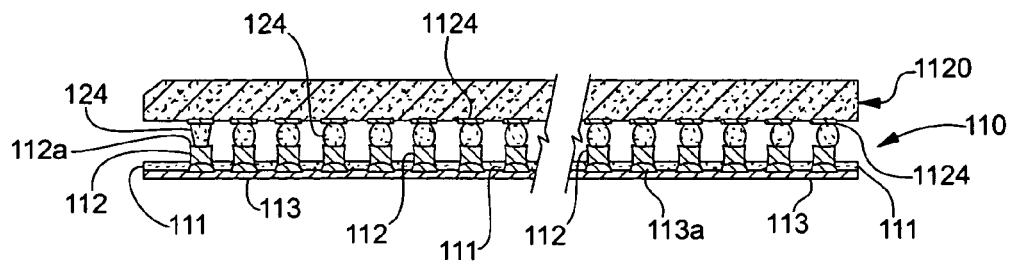
FIG. 7D shows the interposer so made attached to a semiconductor wafer.

FIGS. 7A, 7B and 7C are side cross-sectional diagrams illustrating the fabrication of an interposer 110 as described above in which flexible dielectric adhesive layer 111 is formed prior to conductive vias 112, and FIG. 7D shows the interposer 110 so made attached to a semiconductor wafer 1120. FIG. 7A shows a metal sheet or foil 113 that is provided with at least two relational alignment holes 119 that are utilized to align the various stencils or masks, or the various other layers with metal foil 113 during fabrication of a flexible adhesive interposer 110. Where flexible adhesive layer 111 is applied to metal foil 113 by stenciling or screen printing or the like, the masks, stencils and screens therefor each include a like set of relational alignment holes that are aligned with relational alignment holes 119 of metal foil 113, for example, by alignment pins passing therethrough. The masks, stencils and/or screens employed in the deposition of flexible adhesive to form flexible adhesive layer 111 define via holes 117 therethrough. Where additional thickness of flexible dielectric adhesive layer 111 is desired than can be produced by a single deposition, a second deposition is made after drying or B-staging flexible adhesive layer 111-1 to form flexible adhesive layer 111-2 having the same pattern and via holes 117 as does layer 111-1. Further layers 111-n of flexible dielectric adhesive may be utilized to achieve the desired thickness.

Where flexible adhesive layer 111 (or layers 111-1, 111-2) is a thin sheet or membrane of dried, B-staged or partially-cured flexible dielectric adhesive that is laminated to metal foil 113, such thin sheet or membrane may have via holes 117 already formed therethrough, such as by drilling, punching, die cutting, laser cutting or the like, or via holes 117 may be formed after lamination, such as by laser cutting or laser drilling. Thin sheet 111 beneficially includes a set of relational alignment holes corresponding to those of metal foil 113 for alignment therewith, such as by alignment pins. An oxidation-resistant coating 113a is preferably provided on metal foil 113 where it is exposed at the bottoms of via holes 117.

Conductive vias 112 are formed in via holes 117 preferably by depositing flexible conductive adhesive onto the back side of metal foil 113 exposed through via holes 117 to substantially fill via holes 117, as illustrated in FIGS. 7B and 7C. Metal foil 113 is patterned, for example, by conventional photo-etching, to define conductors and contacts 113. A layer of solderable material, and preferably an oxidation-resistant layer, 112a–112f and 114a–114f is deposited onto flexible adhesive conductive vias 112 and conductors and contacts 113, either prior to or subsequent to the patterning of metal foil 113, but preferably subsequent thereto. Silver, gold, nickel, nickel-gold, nickel-palladium and other oxidation resistant metals, or copper, tin, lead, or indium, may be deposited, preferably by plating, so as to provide suitable solderability and/or bonding to electrically-conductive adhesives. Depending upon the pattern formed in metal foil 113, the electrically-conductive connections formed through flexible adhesive interposer 110 may be "straight-through" connections as illustrated in FIG. 7B, or may provide "fan out" or redistribution of the contact pattern as illustrated in FIG. 7C and as is convenient where the dimension and pitch of the contacts of electronic device 120 are too fine to permit straight-through connection to conventional electronic substrates 140.

Flexible adhesive interposer 110 so formed is shown attached to semiconductor wafer 1120 in FIG. 7D, but prior to the patterning of metal layer 113. Connections 124, which may be solder or electrically conductive adhesive, join wafer-sized interposer 110 to semiconductor wafer 1120 with corresponding contacts 1124 of wafer 1120 electrically connected to the corresponding conductive vias 112 of interposer 110. Connections 124 may be solder connections or flexible conductive adhesive, as desired. Metal foil layer 113 is patterned to leave the desired pattern of solderable contacts, ones of which connect by conductive vias 112 and connections 124 to the appropriate contacts 1124 of the individual electronic devices comprising semiconductor wafer 1120.

The flexible adhesive interposers having solderable flexible conductive adhesive conductive vias according to the present arrangement may be utilized in a wide variety of applications for mounting and/or packaging of electronic devices such as semiconductor devices, integrated circuits, transistors, diodes, resistors, capacitors, inductors, and networks thereof. Such interposers may be utilized in packages for one or more electronic devices, for example, in the packages described in U.S. Pat. No. 6,376,769, (patent application Ser. No. 09/524,148) entitled "HIGH-DENSITY ELECTRONIC PACKAGE, AND METHOD FOR MAKING SAME" filed Mar. 14, 2000.

Figure 8A:
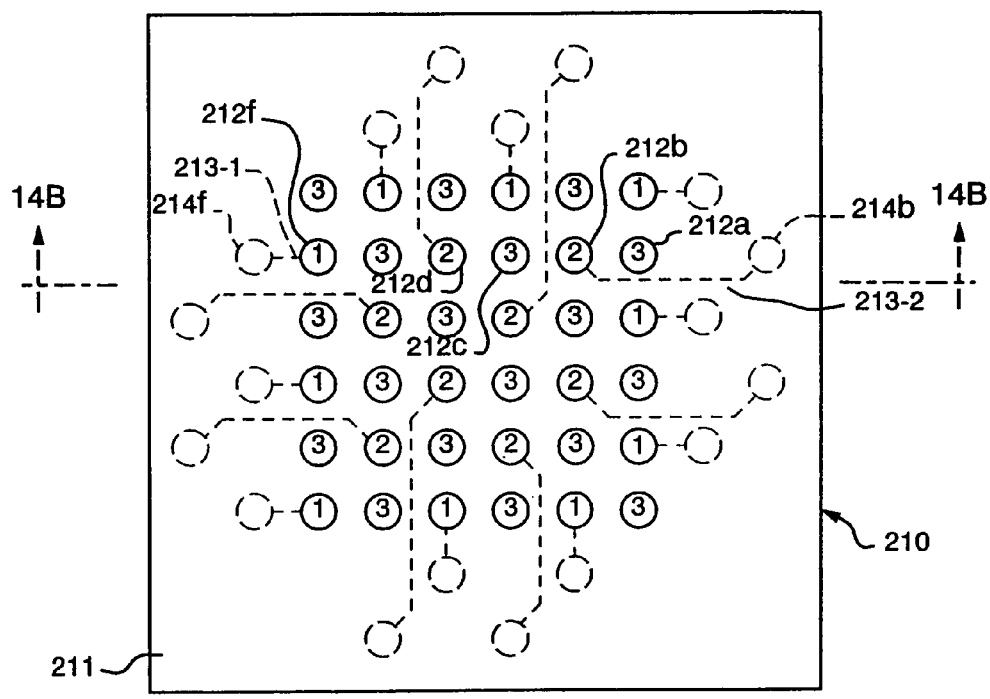
FIGS. 8A and 8B are plan and cross-sectional schematic diagrams, respectively, of an interposer in accordance with the present arrangement and employing plural layers of dielectric material.

FIG. 8A is a plan view of an alternative embodiment of a flexible adhesive interposer 210 relating to the present arrangement and employing plural layers of flexible dielectric adhesive 211. A 6×6 array of contacts 212 on the "top" surface thereof (the surface visible in FIG. 8A) are indicated by solid circles enclosing a number 1, 2 or 3 that indicates the number of layers of flexible dielectric adhesive 211 that the conductive via directly therebelow passes through on a "straight-through" basis. The 6×6 array of contacts 212 are to connect, for example, to the corresponding array of closely-spaced fine-pitch contacts on a 36-contact electronic device such as a semiconductor chip or other electronic component. A fanned-out array of contacts 214 on the bottom or opposing surface of flexible adhesive interposer 210 is indicated by dashed circles, each one connected to a corresponding one of contacts 212 by an electrical conductor indicated by a dashed line 213. The array of contacts 214 are to connect, for example, to a next-level electronic substrate (not shown), such as a semiconductor wafer. By way of notation, lower-case letter suffixes a–f designate rows of contacts of the 6×6 array of contacts, and numerical suffixes indicate the number of layers of flexible adhesive above the item so designated. For example, conductor 213-1 is between the first and second adhesive layers 211-1 and 211-2, respectively. Contacts 212 and 214 typically represent the oxidation-resistant metal coating, such as nickel-gold or gold or nickel-palladium, platinum, on conductive vias 212.

Figure 8B:
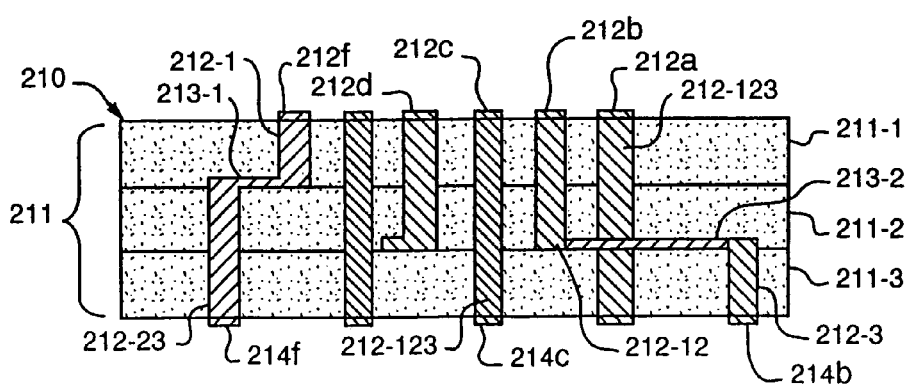

FIG. 8B is a cross-sectional view of the flexible adhesive interposer of FIG. 8A particularly showing the use of plural layers 211-1, 211-2, 211-3 of flexible dielectric material. The example conductive connection between contact 212a and 214a is provided by a conductive via 212-123 which passes straight through first, second and third flexible adhesive layers 212-1, 212-2, 211-3, respectively. The example conductive connection between contact 212b and 214b is provided by a conductive via 212-12 which passes straight through first and second flexible adhesive layers 212-1, 212-2, by a conductor 213-2 located at the interface between the second and third flexible adhesive layers 211-2 and 211-3, and by a conductive via 212-3 which passes through third flexible adhesive layer 211-3. The example conductive connection between contact 212f and 214f is provided by a conductive via 212-1 which passes straight through first flexible adhesive layer 212-1, by a conductor 213-1 located at the interface between the first and second flexible adhesive layers 211-1 and 211-2, and by a conductive via 212-23 which passes straight through second and third flexible adhesive layers 211-2 and 211-3.

In the embodiment of FIGS. 8A and 8B, conductive vias 212 and conductors 213 are flexible electrically-conductive adhesive that is suitable to be plated, such as one of types ESP8350, ESP8450, ESS8450, ESP8550, and ESS8459 flexible conductive thermosetting adhesives, and ESP8680 rigid adhesive, all available from AI Technology, plated with a solderable metal such as copper, nickel, tin, silver, gold, palladium, platinum, nickel-gold, nickel-palladium and the like, and/or a combination and/or alloy thereof. Flexible dielectric adhesive layers 211-1, 211-2, 211-3 are of flexible dielectric adhesives as described in relation to flexible adhesive interposers above.

In a typical fabrication sequence, flexible dielectric adhesive layer 211-1 is deposited with via holes therein on a metal layer or is laminated thereto. Via conductors 212-1 are flexible conductive adhesive deposited into the via holes through flexible adhesive layer 211-1. Conductors 213-1 are flexible conductive adhesive deposited on flexible adhesive layer 211-1, and are dried or B-staged. Flexible dielectric adhesive layer 211-2 is printed thereon with via holes therein, or may be laminated thereto. Via conductors 212-2 are flexible conductive adhesive deposited into the via holes through flexible adhesive layer 211-2. Flexible conductive adhesive conductors 213-2 are deposited on flexible adhesive layer 211-2 and are dried or B-staged. Flexible dielectric adhesive layer 211-3 is printed thereon with via holes therein, or may be laminated thereto. Via conductors 212-3 are flexible conductive adhesive deposited into the via holes in flexible adhesive layer 211-3. The metal layer may be patterned at any convenient point in the foregoing process. Contacts 212a–212f and 214a 214f are plated of a solderable, and preferably oxidation resistant, metal as described above. To the extent via conductors 212 pass straight through one or more layers, they may be deposited through one or more layers at a time, as may be convenient. It is noted that plural-layered flexible adhesive interposers similar to interposer 210 may include greater or lesser numbers of layers 2111-1, 211-2 and so forth, of flexible adhesive and may include other arrangements and/or patterns of contacts 212a, 212b . . . 214a, 214b . . . , conductive vias 212 and conductors 213 as may be desirable or convenient in a particular application.

In utilizing interposer 110, solder balls or bumps 124 and/or 134 are formed in conventional manner on the conductive vias 112 and/or the contact portion 114 of patterned conductors 113 for connecting to electronic device 120 and to a next-level substrate, including another electronic device or another similar interposer, as is described below.

It is noted that alignment holes are also useful, either alone or in conjunction with visual fiducial marks, in positioning and aligning a flexible interposer 110, or a panel or strip of flexible interposers 110, for placement of electronic components 120 thereon using automated component placement apparatus, such as conventional surface mount technology (SMT) pick-and-place equipment, flip-chip bonders, and the like.

Also preferably, a plurality of flexible interposers 110 are formed as a panel or strip of interposers 110 for efficiently processing plural interposers 110, for example, for screening, stenciling, or laminating of the flexible adhesive layers 111 and the metal foil 113, for patterning of the metal foil 113, for depositing conductive vias 112, and for plating of the solderable and/or oxidation resistant layer and possibly for the application of soldering flux. After plural flexible interposers 110 are formed in a panel or a strip, individual flexible interposers are cut or excised from the panel or strip for use. The thickness of each flexible adhesive layer 111 of flexible interposer 110 is preferably comparable to the height of the solder balls 124, 134 to be formed, i.e. typically in the range of about 75–200 μm (about 3–8 mils), and more typically about 100–125 μm (about 4–5 mils).

Referring again to FIGS. 7A–7D, flexible dielectric layer 111 may be minimized or even eliminated as follows. Instead of depositing dielectric layer 111 as shown in FIG. 7A, flexible conductive adhesive bumps 112 are deposited onto metal foil 113 and the metal foil 113 is laminated to or attached to semiconductor wafer 1120 with each of the conductive bumps 112 in contact with the corresponding contact 1124, producing an assembly as in FIG. 7D with connections 124 provided by the flexible conductive adhesive vias 112, i.e. without separate connections 124. Metal foil 113 is then either patterned to leave metal contacts on each of conductive vias 112 or is etched away to leave the ends of conductive vias 112 exposed. The ends of conductive vias 112 are then covered with a solderable material, such as copper, nickel, tin, lead, or indium, and preferably silver, gold, palladium, platinum, nickel-gold, nickel-palladium or the like, such as by plating such material thereon, producing the structure shown in FIG. 9.

Figure 9:
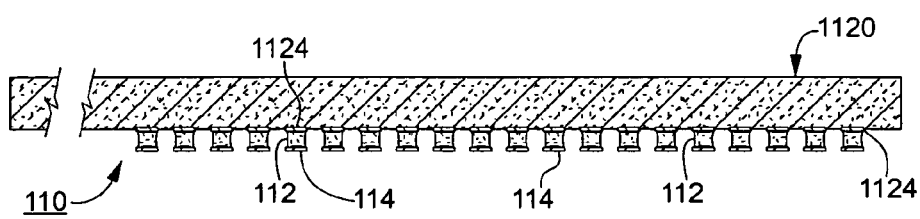
FIG. 9 is a side cross-sectional schematic diagram of an alternative embodiment of a flexible interposer according to the present arrangement.

Alternatively, the interposer arrangement of FIG. 9 may be made directly on semiconductor wafer 1120 or an individual electronic device or an appropriate next-level substrate or a panel thereof. Wafer 1120 has a pattern of contacts 1124 thereon that are preferably plated with an oxidation-resistant material, such as one of the precious metals, e.g., nickel-gold or gold, described above. Typically, contacts 1124 are aluminum or copper pads of about 50–100 μm (about 2–4 mils) diameter. A pattern of conductive flexible adhesive bumps 112 are deposited onto contacts 1124, preferably of a flexible conductive adhesive of the types described above. Bumps 112 are typically of like diameter to the contacts onto which they are deposited, such as by screening, stenciling, dispensing, ink-jet printing or other suitable method, and have a height of about 25–250 μm (about 1–10 mils). After conductive bumps 112 are at least dried or B-staged, and preferably are cured, a solderable coating 114 is applied to the tops (ends) thereof to provide a solderable contact. Suitable solderable coatings include copper, nickel, tin, lead, or indium, and preferably silver, gold, palladium, platinum, nickel-gold, nickel-palladium, and combinations and alloys thereof, applied such as by an electroless plating process (preferred), or another suitable plating or flash coating process. A wafer 1120 and the individual electronic devices produced when such wafer 1120 is singulated, may then be directly attached to a printed circuit board or other substrate by soldering. Such soldering may utilize conventional $C^4$ solder bumps, eutectic solder bumps, deposited either onto solderable contacts 114 of flexible interposer conductive vias 112 or on the corresponding contacts on a printed, circuit board or other next-level substrate. Optionally, a dielectric adhesive layer may be deposited onto wafer 1120 around conductive bumps 112 thereon for protecting wafer 1120 of for providing additional strength. The flexible dielectric adhesives types described above, such as types ESP7450, ESP7550 and ESP7675, are suitable for such optional dielectric layer.

Figure 10:
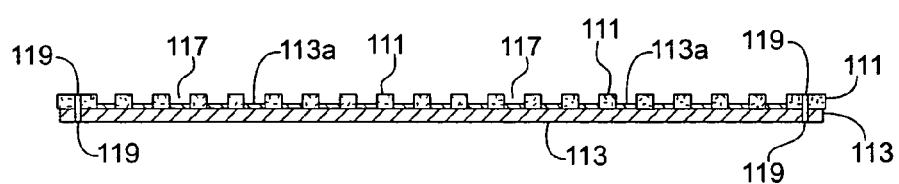
FIGS. 10, 11 and 12 are side cross-sectional schematic diagrams illustrating stages in the fabrication and application of another alternate embodiment of a flexible interposer 110 according to the present arrangement.
Figure 11:
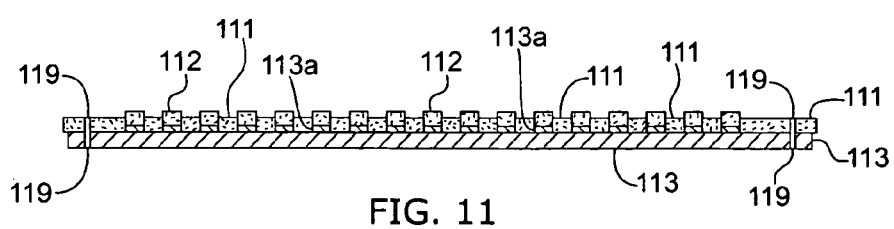
Figure 12:
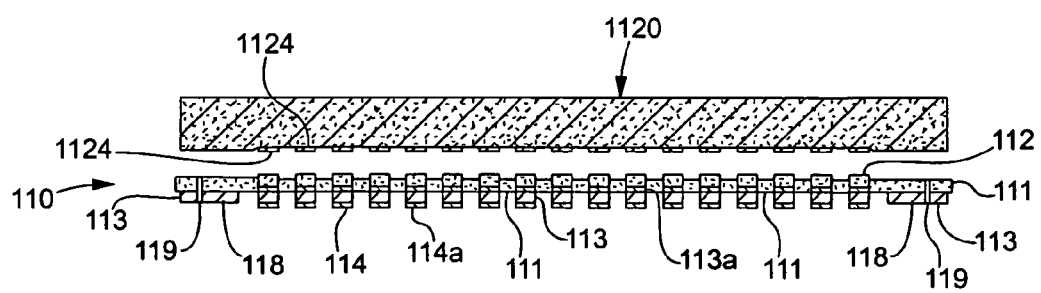

FIGS. 10, 11 and 12 are side cross-sectional schematic diagrams illustrating stages in the fabrication and application of another alternate embodiment of a flexible interposer 110 according to the invention. In FIG. 10, flexible adhesive dielectric layer 111 is deposited in paste form onto metal foil 113 or is laminated in sheet form thereto. Layer 111 includes a pattern of "blind" via holes 117, which are formed in the deposition or thereafter (as by photo-etching or laser drilling or the like or are present in the sheet adhesive as laminated, as described above, to expose the otherwise covered surface of metal foil 113. The exposed portion of metal foil 113 at the bottom of via holes 117 is preferably coated with as oxidation resistant material 113a, e.g., nickel-gold or the like, as described above. The mask or stencil utilized in depositing adhesive layer 111 on metal foil 113, or the sheet of adhesive 111 laminated to metal foil 113, may be accurately positioned and aligned using two or more alignment holes 119 or similar fiducial indicia.

FIG. 11 illustrates blind via holes 117 filled with conductive adhesive, preferably a flexible conductive adhesive as described above, to form conductive vias 112 therein, which vias 112 preferably extend above the surface level of dielectric layer 111. This layered structure is then laminated to a semiconductor wafer 1120 (or another electronic device or substrate or a panel of such items) with conductive vias 112 making connection to contacts 1124 of wafer 1120, either directly or by flexible conductive adhesive bumps or by coating conductive vias 112 with a solderable material, e.g., gold or nickel-gold or the like, as described above. Metal foil 113 is patterned, such as by photo-etching, either before or after the layered structure 110' is attached to semiconductor 1120, to leave solderable contacts 114. Contacts 114, which may be of the same, smaller or larger diameter than conductive vias 112, may be coated with a solderable material if needed for solderability, for example, with a solderable metal such as nickel-gold or the like as described above.

The resulting solderable flexible adhesive interposer 110, illustrated in FIG. 12, is typically 25–250 μm (about 1–10 mils) thick, and more usually 75–125 μm (about 3–5 mils) thick. It is noted that the etching process limits the ratio of the diameter of contacts 114 to the thickness thereof to about two. A wide "ring" 118 of metal foil 113 may be left near the periphery of interposer 110 to provide additional mechanical strength and support, particularly in the locations of alignment holes 119 or other fiducial indicia. Ring 118 may be the same thickness as metal foil 113, as above, or may be slightly thinner, e.g., 50–100 μm (about 2–4 mils).

Figure 11A:
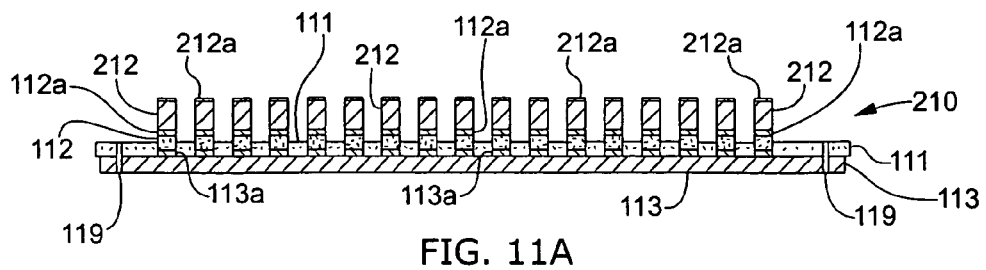
FIGS. 11A and 11B are side cross-sectional schematic diagrams illustrating fabrication additional to the stage of FIG. 11 for producing another alternate embodiment according to the present arrangement.
Figure 11B:
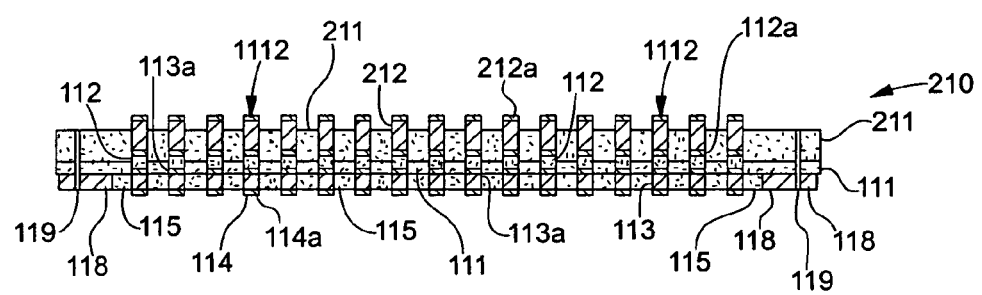

FIGS. 11A and 11B are side cross-sectional schematic diagrams illustrating fabrication steps additional to the stage of FIG. 11 for producing an alternate embodiment 210 of interposer 110 that has a substantially longer conductors 1112 for connecting between an electronic device and another substrate. Columns 212 of conductive metal, such as copper, aluminum, nickel, tin, lead, indium, gold or other suitable metal, are formed, such as by plating, on flexible conductive adhesive vias 112 to increase the length thereof. Preferably, copper is electrolytically plated. Conductive vias 112 are preferably coated with a metal plating 112a, such as a gold, palladium, platinum, gold-nickel or gold-palladium layer, prior to the plating of the column 212 of copper or aluminum thereon to provide a more stable contact resistance therebetween. Metal columns 212 are preferably plated with a solderable metal 212a, which may also be oxidation resistant, such as a gold, palladium, platinum, gold-nickel or gold-palladium layer as above.

Optionally, as illustrated in FIG. 11B, an additional layer 211 of flexible dielectric adhesive may be applied over flexible dielectric layer 111 and surrounding metal columns 212 where additional strength is desired for interposer 210. Preferably, both of layers 111, 211 are of the same type of flexible dielectric adhesive such as the adhesives identified above. It is noted that any number of layers of flexible dielectric adhesive may be deposited, each preferably being dried, B-staged or cured prior to the deposition of the next layer thereof, thereby to obtain any desired thickness of flexible adhesive. Metal foil 113 is patterned to define contacts 114 and optional peripheral strengthening ring 118, and contacts 114 may be plated with a solderable metal 114a, which may also be oxidation resistant, all as described above. Optionally, flexible dielectric adhesive 115, preferably of like type to that of layer 111, may be deposited in the space between the remaining portions of metal foil 113, i.e. surrounding contacts 114, 114a, where additional mechanical strength is desired.

Advantages of solderable flexible adhesive interposer 210 include that the increased length of conductors 1112, which length can exceed one or two times its diameter, provides additional flexibility in the connections between an electronic device and the substrate to which it connects, thereby increasing the reliability of such connections under thermal cycling stress, even if both ends of conductors 1112 are soldered. Moreover, because each of conductors 1112 contains a portion provided by conductive via 112 that is flexible because it is of a flexible conductive adhesive, conductor 1112 is itself flexible and also serves to reduce the stress produced by thermal cycling conditions. In addition to use for connecting an electronic device to a substrate, flexible adhesive interposers 110, 210 may be applied to an electronic and utilized for making connections thereto for the purpose of testing such device, including semiconductor devices on a semiconductor wafer or as individual devices singulated from such wafer.

It is noted that where plural-layered solderable metal coatings are employed, such as the nickel-gold or nickel-palladium coatings, the nickel is plated onto the copper or aluminum metal and the gold or palladium is plated onto the nickel layer so as to be exposed for coming into contact with the solder or conductive adhesive that will be placed in contact therewith.

Layers of flexible adhesive are typically deposited at a wet thickness of about 150–300 μm (about 6–12 mils) and more typically of about 225 μm (typically about 9 mils), which dries and/or cures to a thickness of about 150 μm (about 6 mils). Via openings 117 typically range between about 25 μm to 2.5 mm (about 1–100 mils) in diameter, with an about 300-μm (about 12-mil) diameter being typical for some via openings and an about 250-μm (about 10-mil) diameter being typical for slightly smaller via openings 542, and about 100 μm (about 4 mils) being typical for semiconductor contacts. Where the metal foil is laminated to a sheet of flexible adhesive, lamination is at a temperature typically between 80° C. and 150° C. with lamination heating and pressure applied by heated rollers.

The methods herein are suitable for making solderable flexible adhesive interposers individually or for making a number of interposers contemporaneously, as where panels or webs of metal foil and/or of flexible adhesive layers are utilized in a batch process or in a continuous process. In a batch process, a panel or panels, e.g., a 25 by 31 cm (about 10 by 12 inch) panel or a 31 by 50 cm (about 12 by 20 inch) panel, of the aforementioned material or materials is utilized and a number of interposers are formed therewith and thereon, such as by screen and/or stencil deposition of layers of flexible adhesive. In a continuous process, a web or strip, e.g., of a 12.5 to 25 cm (about 5 inch to 10 inch) width, is utilized and is moved along as the various layers are roll deposited thereon or are roll laminated thereto. The web or strip may have drive sprocket holes along one or both edges thereof for moving it along in a controlled manner. After a plurality of flexible adhesive interposers are formed in a panel or strip, the panel or strip, as the case may be, is excised to produce the individual interposers therefrom.

If either the flexible dielectric adhesive or the flexible electrically conductive adhesive or both is a thermosetting adhesive, it is preferred to cure such thermosetting flexible adhesive prior to forming a solderable electrically conductive metal layer thereon and prior to etching or otherwise patterning the metal foil layer. It is noted that an adhesive, whether dielectric or conductive, can be said to withstand soldering temperature if it is a thermosetting adhesive that does not melt or substantially change in its electrical and mechanical properties when heated to the melting temperature of solder or is a thermoplastic adhesive having a melt flow temperature that exceeds the melting temperature of solder.

While the present invention has been described in terms of the foregoing example embodiments, variations within the scope and spirit of the present invention as defined by the claims following will be apparent to those skilled in the art. For example, while the electronic device contained within each of the various embodiments of the package described herein are described as a semiconductor chip or die, such as an integrated circuit or the like, such devices may include other types and kinds of electronic components such as resistors, capacitors, inductors, and networks of such devices and combinations thereof, as well as plural semiconductor chips or die, either alone or in combination with other components.

Where plural layers are employed in the flexible dielectric adhesive interposers described herein, it is evident that a greater or lesser number of layers may be utilized to achieve more complex or simpler fan-out patterns as may be convenient in any particular instance, without departing from the inventive concept described herein or the method for making a particular embodiment or alternative thereto.

Flexible adhesive interposers according to the present invention may be provided with bumps of solder or of conductive adhesive on the contacts thereof to facilitate the attachment of semiconductor chips and other electronic devices thereto, and/or with a pre-applied epoxy underfill adhesive, such as AI Technology type ESP7675, thereon, and/or with a pre-applied adhesive film, such as AI Technology type ESP7450, thereon for bonding other items, such as a shaping frame or cover, thereto.

In addition, the electronic device packages of the present invention may be employed in combination with other conventional mounting technology, such as ball-grid array (BGA) technology and pin-grid array (PGA) technology. In such case a package according to the present invention is mounted to a conventional BGA or PGA solderable substrate which is in turn attached to a next-level substrate in conventional BGA or PGA manner.

What is claimed is:

1. A molecularly flexible dielectric electronic substrate having a modulus of elasticity less than about 500,000 psi, said molecularly flexible dielectric electronic substrate comprising:
   a first layer of molecularly flexible dielectric adhesive having a modulus of elasticity less than about 500,000 psi, having a glass transition temperature less than about 0° C., and having the ability to withstand soldering at a temperature of about 220° C.;
   a metal foil on a first surface of said first layer of molecularly flexible dielectric adhesive, wherein said metal foil is patterned to define a pattern of electrical conductors having a plurality of contact sites for receiving a plurality of contacts of an electronic device; and
   a plurality of electrically conductive vias through said first layer of molecularly flexible dielectric adhesive, said plurality of electrically conductive vias being in a pattern for providing electrical connection between ones of said pattern of electrical conductors on the first surface of said first layer of molecularly flexible dielectric adhesive and corresponding contact sites on a second surface of said first layer of molecularly flexible dielectric adhesive opposite the first surface thereof.

2. The molecularly flexible dielectric electronic substrate of claim 1 wherein said plurality of contact sites are in a pattern corresponding to a pattern of contacts of an electronic device.

3. The molecularly flexible dielectric electronic substrate of claim 1 further comprising an electronic device having a plurality of contacts soldered to corresponding ones of the contacts sites of the patterned metal foil on said molecularly flexible dielectric adhesive layer.

4. The molecularly flexible dielectric electronic substrate of claim 1 wherein said molecularly flexible dielectric adhesive has a modulus of elasticity less than about 100,000 psi.

5. The molecularly flexible dielectric electronic substrate of claim 1 wherein said molecularly flexible dielectric adhesive has a modulus of elasticity less than about 20,000 psi.

6. The molecularly flexible dielectric electronic substrate of claim 1 further comprising a plated electrically conductive layer on at least the contact sites of said metal foil.

7. A molecularly flexible dielectric electronic substrate comprising:
   at least one layer of molecularly flexible dielectric adhesive having a modulus of elasticity less than about 500,000 psi, having a glass transition temperature less than about 0° C., and baying the ability to withstand soldering at a temperature of about 220° C.;
   a metal foil on one surface of said layer of molecularly flexible dielectric adhesive, wherein said metal foil is patterned to define a pattern of electrical conductors having a plurality of contact sites for receiving the contacts of an electronic device;
   an electronic device having a plurality of contacts soldered to corresponding contacts sites of the patterned metal foil on said molecularly flexible dielectric adhesive layer; and
   a protective enclosure surrounding said electronic device and attached at least along its periphery to said molecularly flexible dielectric adhesive layer.

8. A molecularly flexible dielectric electronic substrate comprising:
   at least one layer of molecularly flexible dielectric adhesive having a modulus of elasticity less than about 500,000 psi, having a glass transition temperature less than about 0° C., and having the ability to withstand soldering at a temperature of about 220° C.;
   a metal foil on one surface of said layer of molecularly flexible dielectric adhesive, wherein said metal foil is patterned to define a pattern of electrical conductors having a plurality of contact sites for receiving the contacts of an electronic device;
   an electronic device having a plurality of contacts soldered to corresponding contacts sites of the patterned metal foil on said molecularly flexible dielectric adhesive layer; and an underfill adhesive bonding said electronic device and said molecularly flexible dielectric adhesive layer.

9. The molecularly flexible dielectric electronic substrate of claim 8 wherein said underfill adhesive includes molecularly flexible dielectric adhesive having a modulus of elasticity less than about 500,000 psi.

10. A molecularly flexible dielectric electronic substrate comprising:
a first layer of molecularly flexible dielectric adhesive having a modulus of elasticity less than about 500,000 psi, having a glass transition temperature less than about 0° C., and having the ability to withstand soldering at a temperature of about 220° C.;
a first metal foil on a first exposed surface of said first layer of molecularly flexible dielectric adhesive, wherein said first metal foil is patterned to define a pattern of first electrical conductors having a plurality of contact sites for receiving the contacts of an electronic device;
a second metal foil on a second exposed surface of said first layer of molecularly flexible dielectric adhesive opposing the first surface thereof, wherein said metal foil is patterned to define a pattern of second electrical conductors; and
a plurality of electrically conductive vias through said first layer of molecularly flexible dielectric adhesive, said plurality of electrically conductive vias being in a pattern for providing electrical connection between ones of said first electrical conductors and ones of said second electrical conductors.

11. The molecularly flexible dielectric electronic substrate of claim 10 further comprising:
a second layer of molecularly flexible dielectric adhesive having a modulus of elasticity less than about 500,000 psi, having a glass transition temperature less than about 0° C., and having the ability to withstand soldering at a temperature of about 220° C., wherein said second layer of molecularly flexible dielectric adhesive adheres to the second surface of said first layer of molecularly flexible dielectric adhesive with said patterned second metal foil therebetween;
a third metal foil oh an exposed surface of said second layer of molecularly flexible dielectric adhesive, wherein said third metal foil is patterned to define a pattern of third electrical conductors; and
a plurality of second electrically conductive vias through said second layer of molecularly flexible dielectric adhesive, said plurality of second electrically conductive vias being in a pattern for providing electrical connection between ones of said second electrical conductors and ones of said third electrical conductors.

12. The molecularly flexible dielectric electronic substrate of claim 10 wherein said molecularly flexible dielectric adhesive has a modulus of elasticity less than about 100,000 psi.

13. The molecularly flexible dielectric electronic substrate of claim 10 wherein said molecularly flexible dielectric adhesive has a modulus of elasticity less than about 20,000 psi.

14. The molecularly flexible dielectric electronic substrate of claim 10 in combination with at least one electronic device having a plurality of contacts thereon connected to at least certain ones of the contact sites of said first electrical conductors.

15. The molecularly flexible dielectric electronic substrate of claim 10 wherein said conductive vias are built up of plated metal.

16. The molecularly flexible dielectric electronic substrate of claim 10 further comprising a plated electrically conductive layer an at least the contact sites of said first metal foil.

17. The molecularly flexible dielectric electronic substrate of claim 11 wherein said conductive vias are built up of plated metal.

18. The molecularly flexible dielectric electronic substrate of claim 11 wherein said molecularly flexible dielectric adhesive has a modulus of elasticity less than about 100,000 psi.

19. The molecularly flexible dielectric electronic substrate of claim 11 wherein said molecularly flexible dielectric adhesive has a modulus of elasticity less than about 20,000 psi.

20. A method for making a molecularly flexible electronic substrate for receiving an electronic device comprising:
providing a sheet of metal foil;
providing on one a first surface of the sheet of metal foil a first layer of a molecularly flexible dielectric adhesive having a modulus of elasticity less than about 500,000 psi, having a glass transition temperature less than about 0° C., and having the ability to withstand soldering at a temperature of about 220° C., the first layer of molecularly flexible dielectric adhesive having a plurality of via openings therein;
building up electrically conductive material on the first surface of the metal foil to fill the plurality of via openings in the first layer of molecularly flexible dielectric adhesive, thereby forming a plurality of electrically conductive vias therein;
wherein the plurality of electrically conductive vias are in a pattern for providing electrical connection between the metal foil and corresponding contact sites on a second surface of the first layer of molecularly flexible dielectric adhesive opposite the first surface thereof;
patterning the metal foil to form a pattern of contacts and conductors electrically connected to the electrically conductive vias in the first molecularly flexible dielectric adhesive layer; and
plating at least one of the electrically conductive vias and the contacts of the patterned metal foil to provide external contacts.

21. The method of claim 20 further comprising:
providing a second metal foil on the second surface of the first layer of molecularly flexible dielectric adhesive opposing the first surface thereof, wherein the second metal foil electrically connects to the plurality of electrically conductive vias in the first molecularly flexible dielectric adhesive layer; and
patterning the second metal foil to form a pattern of contacts and conductors electrically connected to ones of the plurality of electrically conductive vias in the first molecularly flexible dielectric adhesive layer.

22. The method of claim 20 further comprising:
after said patterning the metal foil, providing on the surface of the electrical conductors of the patterned sheet of metal foil not having the first layer of molecularly flexible dielectric adhesive thereon a second layer of a molecularly flexible dielectric adhesive having a modulus of elasticity less than about 500,000 psi, having a glass transition temperature less than about 0° C., and having the ability to withstand soldering at a temperature of about 220° C., the at-least second layer of molecularly flexible dielectric adhesive having a plurality of via openings therein; and building up electrically conductive material on the metal foil to fill the plurality of via openings in the second layer of molecularly flexible dielectric adhesive, thereby forming a plurality of electrically conductive vias therein.

23. The method of claim 20 further comprising electrically connecting contacts of at least one electronic device to corresponding ones of the plurality of electrically conductive vias.

* * * * *